(12) United States Patent
Lu et al.

(10) Patent No.: US 10,161,571 B1
(45) Date of Patent: Dec. 25, 2018

(54) LED TUBE WITH SAFETY DEVICE

(71) Applicant: Xiamen PVTECH Co., Ltd., Xiamen, Fujian (CN)

(72) Inventors: Fuxing Lu, Fujian (CN); Rongtu Liu, Nanan (CN)

(73) Assignee: Xiamen PVTECH Co., Ltd., Xiamen, Fujian (CN)

(*) Notice: Subject to any disclaimer, the term of this patent is extended or adjusted under 35 U.S.C. 154(b) by 0 days.

(21) Appl. No.: 15/838,379

(22) Filed: Dec. 12, 2017

(30) Foreign Application Priority Data

Sep. 8, 2017 (CN) .......................... 2017 1 0805085

(51) Int. Cl.
| | | |
|---|---|---|
| *F21K 99/00* | (2016.01) | |
| *F21K 9/278* | (2016.01) | |
| *F21V 23/06* | (2006.01) | |
| *F21K 9/275* | (2016.01) | |
| *H05B 33/08* | (2006.01) | |
| *F21Y 103/10* | (2016.01) | |
| *H01L 25/075* | (2006.01) | |
| *H01L 33/62* | (2010.01) | |
| *H01L 23/62* | (2006.01) | |
| *F21Y 115/10* | (2016.01) | |

(52) U.S. Cl.
CPC .............. *F21K 9/278* (2016.08); *F21K 9/275* (2016.08); *F21V 23/06* (2013.01); *H05B 33/0809* (2013.01); *H05B 33/089* (2013.01); *F21Y 2103/10* (2016.08); *F21Y 2115/10* (2016.08); *H01L 23/62* (2013.01); *H01L 25/0753* (2013.01); *H01L 33/62* (2013.01)

(58) Field of Classification Search
CPC ....................................................... F21K 9/278
USPC ......................................................... 362/221
See application file for complete search history.

(56) References Cited

U.S. PATENT DOCUMENTS

| | | | | |
|---|---|---|---|---|
| 2016/0081147 A1* | 3/2016 | Guang | ............... | H05B 33/0803 315/123 |
| 2017/0138580 A1* | 5/2017 | Wen | ........................ | F21V 25/10 |
| 2018/0031186 A1* | 2/2018 | Li | ........................... | F21K 9/278 |
| 2018/0100644 A1* | 4/2018 | Xiong | ..................... | F21V 25/02 |

* cited by examiner

*Primary Examiner* — Allyson Trail
(74) *Attorney, Agent, or Firm* — Winston Hsu

(57) ABSTRACT

A LED tube with a safety device is provided. The LED tube is connected with an external power supply, comprises: two conductive needle groups, each of the conductive needle groups includes two needles; at least a LED light-emitting component configured to be electrically connected with the needles; and a plurality of fuses configured at the conductive needle groups, respectively.

3 Claims, 3 Drawing Sheets

LED TUBE WITH SAFETY DEVICE

BACKGROUND OF THE INVENTION

1. Field of the Invention

The invention relates to a Light Emitting Diode (LED) tube and, more particularly, relates to a LED tube with a safety device.

2. Description of the Prior Art

Conventional LED tubes on the market do not include any fuse device. When the voltage at the lamp base is not stable, ignition is easily generated under a poor contact situation. Then, the position of the contact point has an arc-drawing high temperature. The LED is easily burnt out. When the first LED in the series connection is burnt out, the subsequent LEDs cannot be used.

SUMMARY OF THE INVENTION

A LED tube with a safety device is provided. The LED tube is connected with an external power supply, comprises: two conductive needle groups, each of the conductive needle groups includes two needles; at least a LED light-emitting component configured to be electrically connected with the needles; and a plurality of fuses configured at the conductive needle groups, respectively.

In an embodiment, the LED tube further includes a base and a lamp cover, the conductive needle groups, the fuse, and the LED light-emitting component are configured at the base, and the lamp cover covers the LED light-emitting component.

In an embodiment, the LED tube is a T type tube.

In an embodiment, the LED tube is a T8 type tube, a T10 type tube, or a T12 type tube.

In an embodiment, the LED tube further includes an electronic rectifier electrically connected with the needles of the conductive needle groups, respectively.

In embodiments, the fuse is directly riveted at the needles of the LED tube. When ignition is generated under a poor contact situation of the LED tube, the heat is conducted to a heat-sensitive material inside the fuse 14 via the needles 100. When the temperature reaches the temperature for the action of the heat-sensitive material, the fuse 14 is melt to cut the current flow, which is much safer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

These and other features, aspects and advantages of the invention will become better understood with regard to the following embodiments and accompanying drawings.

DETAILED DESCRIPTION

These and other features, aspects, and advantages of the disclosure will become better understood with regard to the following description, appended claims, and accompanying drawings. However, the embodiments are not limited herein. The description of the operation of components is not used for limiting the execution sequence. Any equivalent device with the combination according to the disclosure is in the scope of the disclosure. The components shown in figures are not used for limit the size or the proportion. The same or similar numbers denote the same or similar components. The terms "and/or" includes one or more related components, steps and so on.

Unless otherwise defined, all terms (including technical and scientific terms) have the same meaning as commonly understood for people skilled in the art. Unless explicitly defined, terms commonly used in dictionaries have meanings consistent with the content of the related art, but not have an excessive idealized or overly formal sense understanding.

Embodiments are illustrated with figures but not used to limit the scope of the invention. The invention will be better understood with the embodiments hereinafter.

Figure 1:
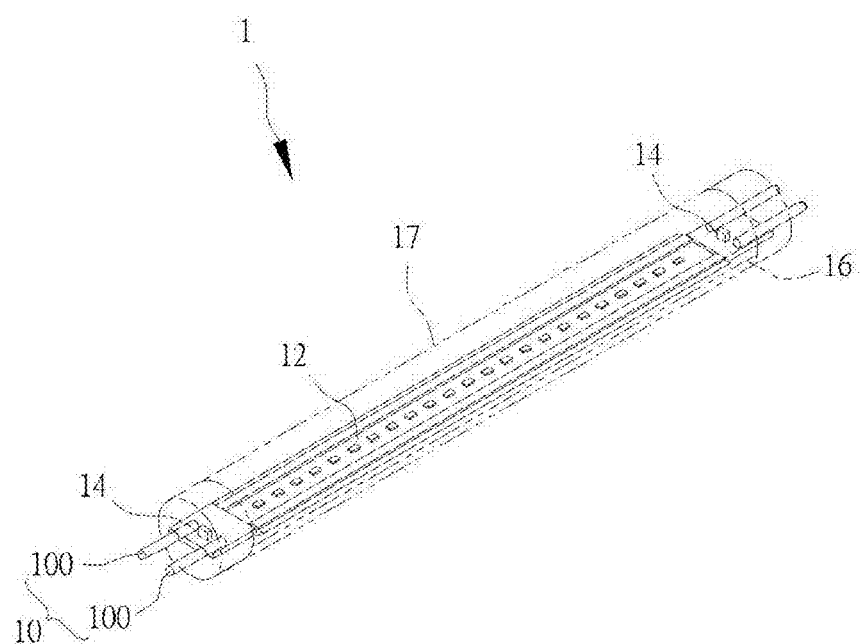
FIG. 1 is a schematic diagram showing a LED tube in an embodiment.
Figure 2:
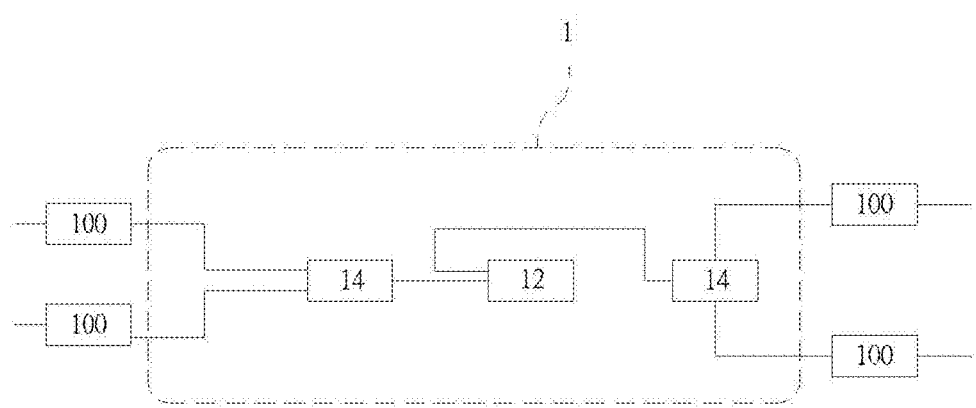
FIG. 2 is a block diagram showing a circuit of a LED tube in an embodiment.
Figure 3:
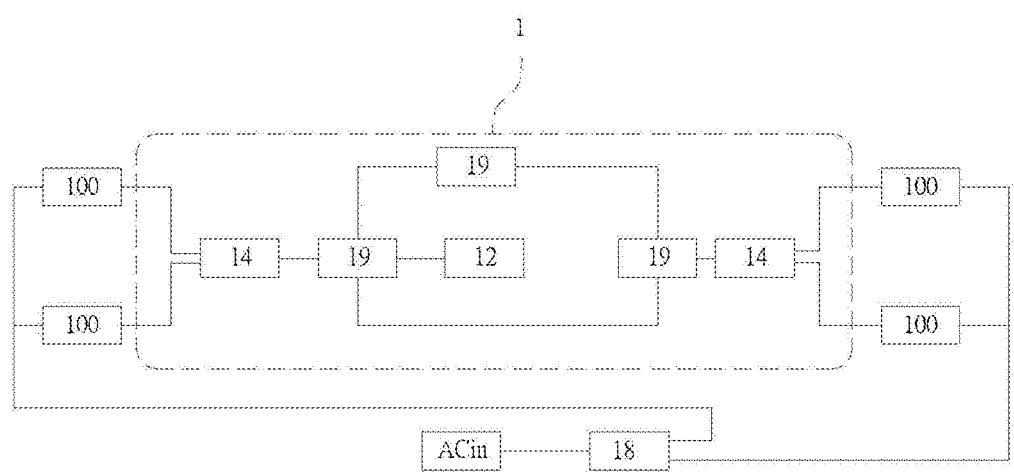
FIG. 3 is a block diagram showing an electronic rectifier in an embodiment.

FIG. 1 is a schematic diagram showing a LED tube in an embodiment. FIG. 2 is a block diagram showing a circuit of a LED tube in an embodiment. FIG. 3 is a block diagram showing an electronic rectifier in an embodiment. In an embodiment, a LED tube with a safety device is connected with an external power supply (such as an AC voltage). The LED tube 1 includes conductive needle groups 10, a LED light-emitting component 12, and a fuse 14. In the embodiment, each conductive needle groups 10 includes two needles 100. The LED light-emitting component 12 is electrically connected with the needles 100. Each fuse 14 is configured at the conductive needle groups 10.

The LED tube 1 further includes a base 16 and a lamp cover 17. The conductive needle groups 10, the LED light-emitting component 12, and the fuse 14 are configured at the base 16. The lamp cover 17 is configured at the base 16 and covers the LED light-emitting component 12.

In embodiments, the LED tube is a T type tube, such as a T8 type tube, a T10 type tube, or a T12 type tube. Please refer to FIG. 3. The electronic rectifier 18 is electrically connected with the needles 100 of the conductive needle groups 10. The electronic rectifier 18 is configured to limit and make an output voltage of the electronic rectifier 18 stable via the capacitor 19.

In the embodiment, the fuse 14 is directly riveted at the needles 100 of the LED tube 1. In an embodiment, the needles 100 are made of copper. When ignition is generated under a poor contact situation of the LED tube, the heat is conducted to a heat-sensitive material inside the fuse 14 via the needles 100. When the temperature reaches the temperature for the action of the heat-sensitive material, the fuse 14 is melt to cut the current flow, which is much safer.

Although the invention has been disclosed with reference to certain embodiments thereof, the disclosure is not for limiting the scope. Persons having ordinary skill in the art may make various modifications and changes without departing from the scope of the invention. Therefore, the scope of the appended claims should not be limited to the description of the embodiments described above.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A LED tube with a safety device, connected with an external power supply, comprising:
   two conductive needle groups, each of the conductive needle groups includes two needles;
   at least a LED light-emitting component configured to be electrically connected with the needles;
   a plurality of fuses directly riveted at the conductive needle groups, respectively; and
   an electronic rectifier electrically connected with the needles of the both conductive needle groups;
   wherein the LED tube is T type tube.

2. The LED tube with the safety device according to claim 1, wherein the LED tube further includes a base and a lamp cover, the conductive needle groups, the fuse, and the LED light-emitting component are configured at the base, and the lamp cover covers the LED light-emitting component.

3. The LED tube with the safety device according to claim 1, wherein the LED tube is a T8 type tube, a T10 type tube, or a T12 type tube.

* * * * *